United States Patent [19]

Zhang et al.

[11] Patent Number: 6,039,889
[45] Date of Patent: Mar. 21, 2000

[54] PROCESS FLOWS FOR FORMATION OF FINE STRUCTURE LAYER PAIRS ON FLEXIBLE FILMS

[75] Inventors: Lei Zhang, San Jose; William Chou, Cupertino; Michael G. Peters, Santa Clara; Solomon I. Beilin, San Carlos, all of Calif.

[73] Assignee: Fujitsu Limited, Japan

[21] Appl. No.: 09/229,502

[22] Filed: Jan. 12, 1999

[51] Int. Cl.⁷ .................................................. H05K 3/02
[52] U.S. Cl. ............................... 216/17; 216/13; 216/18; 216/39
[58] Field of Search ................................. 216/2, 13, 17, 216/18, 39, 44, 105; 427/96, 97, 98; 438/700, 703

[56] References Cited

U.S. PATENT DOCUMENTS

| 4,931,148 | 6/1990 | Kukanskis et al. | 204/15 |
|---|---|---|---|
| 5,252,195 | 10/1993 | Kobayashi et al. | 205/126 |
| 5,355,283 | 10/1994 | Marrs et al. | 361/760 |
| 5,386,627 | 2/1995 | Booth et al. | 29/852 |
| 5,404,044 | 4/1995 | Booth et al. | 257/698 |
| 5,567,329 | 10/1996 | Rose et al. | 216/18 |
| 5,638,597 | 6/1997 | Cutting et al. | 29/830 |
| 5,693,364 | 12/1997 | Kukanskis | 427/97 |

OTHER PUBLICATIONS

Advanced Electronics, Inc. Apr. 30, 1998 from *interConnection Technology* "Comparison of Printed Flexible Circuitry and Traditional Cabling" Dec. 1992.
Grimes Distribution, Inc. MSDS Etertec® HP Series Dry Film Plating & Etching Photoresist.
Grimes Distribution, Inc. MSDS Etertec® 7400 Series Dry Film Plating, Tenting & Etching (Alkaline or Acid) Photoresist.
Grimes Distribution, Inc. MSDS Etertec® 7200 Series Dry Film Plating, Tenting & Etching (Alkaline or Acid) Photoresist.
Grimes Distribution, Inc. MSDS Etertec® 5600 Series Dry Film Plating & Etching Photoresist.
Allied Signal Aerospace Home Page Apr. 30, 1998 "Printed Circuit Board Technology".
Sharp Corporation Press Release Apr. 22, 1997 Flexible built-up Multi-Layer Printed Circuit Board.

*Primary Examiner*—Richard Bueker
*Assistant Examiner*—Alva C Powell
*Attorney, Agent, or Firm*—Coudert Brothers

[57] ABSTRACT

Processes for forming conductive vias between circuit elements formed on either side of a flexible substrate are disclosed. In one embodiment, the inventive process starts with a flexible film polyimide substrate on each side of which is arranged a layer of copper. Both of the copper surfaces are coated with photoresist. Blind vias are then drilled through the top copper layer and substrate using a laser. The photoresist is then exposed (patterned). A plating operation is used to fill the vias with a conductive material. The resist is then developed and the line and pad structures on the surface of the copper layer are plated. The photoresist is then stripped. In a variation of this embodiment, the photoresist is imaged prior to drilling of the vias using a laser. In an alternative embodiment of the inventive process, a through hole is drilled instead of a blind via. In either embodiment, there is no process step between the photo-exposure of the resist and the laser drilling which can impact the dimensions of the substrate.

20 Claims, 2 Drawing Sheets

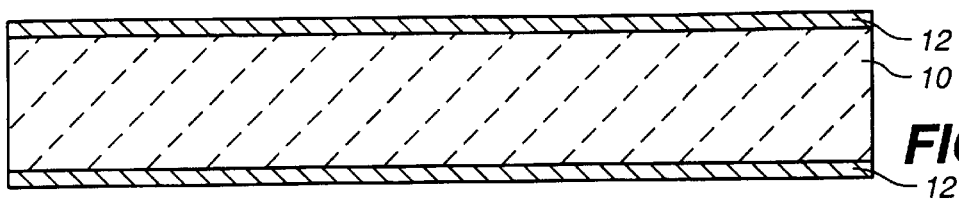
FIG._1A
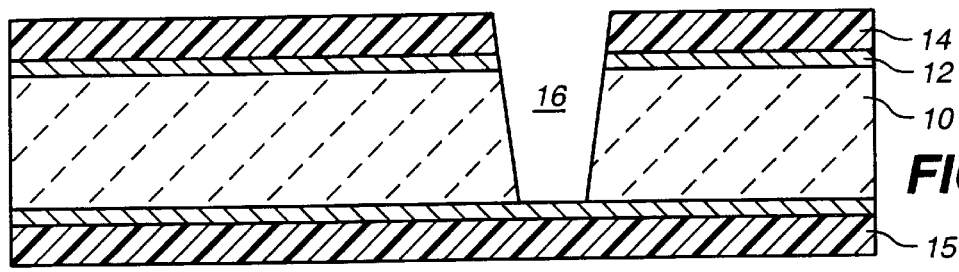
FIG._1B
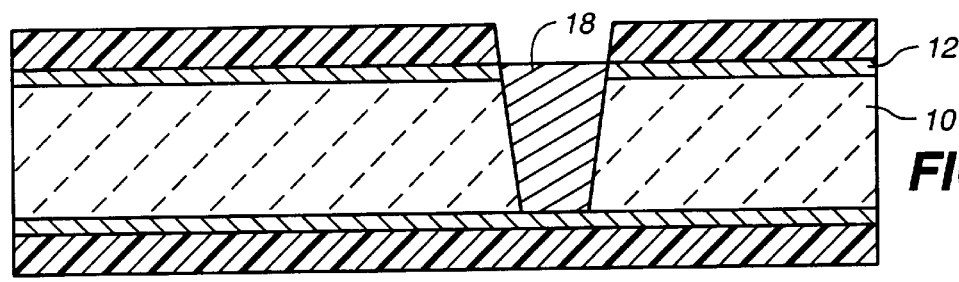
FIG._1C
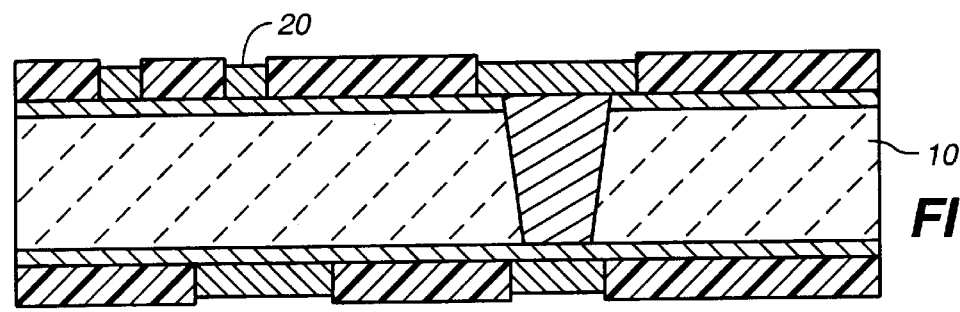
FIG._1D
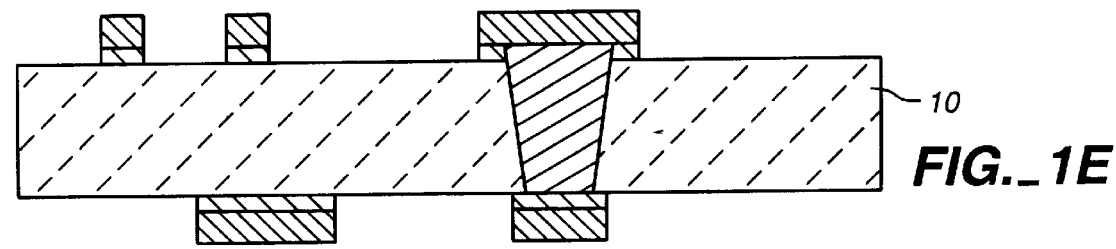
FIG._1E

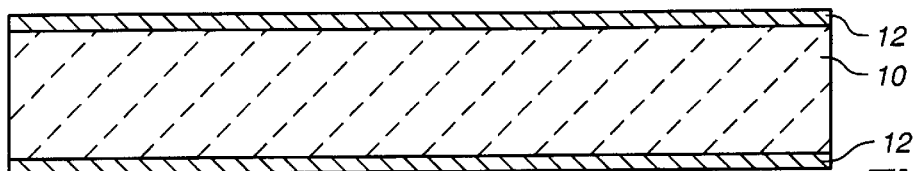
FIG._2A
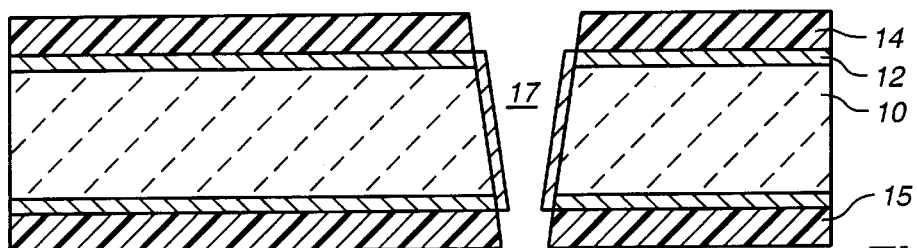
FIG._2B
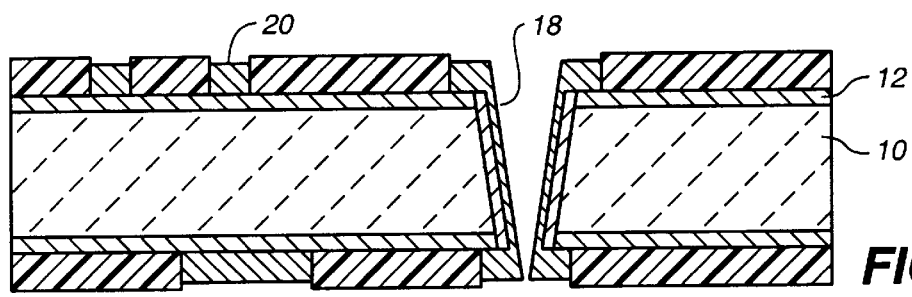
FIG._2C
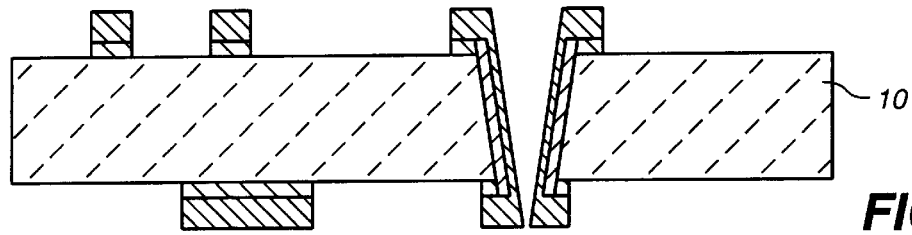
FIG._2D

PROCESS FLOWS FOR FORMATION OF FINE STRUCTURE LAYER PAIRS ON FLEXIBLE FILMS

BACKGROUND OF THE INVENTION

1. Field of the Invention

The present invention relates to the fabrication of double-sided and multi-layer printed circuit boards, and more specifically, to a method of fabricating such structures using flexible film substrates which maintains the alignment between vias formed through the film and conductive pads on two sides of the film.

2. Description of the Prior Art

Double-sided and multi-layer printed circuit boards are now commonly used in the semiconductor industry to increase the density of integrated circuits. Such boards are typically formed from a planar substrate (or substrates) having printed circuitry on each side. The conductive layers on the surfaces of the substrate(s) are interconnected by conductive vias formed through the substrates. In a typical process flow, the vias (also referred to as "through holes" when they pass completely through a substrate) are drilled or punched through the substrate(s) followed by the electroless deposition of metal on the non-conductive surfaces of the holes. Conductive pads connected to either end of a via may be defined by exposure of a photoresist layer, followed by a plating step.

Flexible substrates formed from polyimide films are one type of substrate used to form double-sided and multi-layer printed circuit boards. The flexible circuitry so formed is an array of conductors bonded to a thin, flexible dielectric film (e.g., polyimide). Such structures have the property of being a three-dimensional circuit that can be shaped into multi-planar configurations, rigidized in specific areas, and molded to backer boards for specific applications. When used as an interconnect, the main advantages of flexible circuit based interconnects over traditional cabling are greater reliability, size and weight reduction, elimination of mechanical connectors, elimination of wiring errors, increased impedance control and signal quality, circuit simplification, greater operating temperature range, and higher circuit density. In many applications, lower cost is another advantage of using flexible circuits. In general, flexible circuits provide the benefits of reduced weight and increased circuit density over standard rigid printed circuit boards.

Although flexible circuitry has the advantages noted, certain problems are presented when flexible substrates are used during the formation of double-side circuits. In particular, the process flows conventionally used to form such structures have difficulty in maintaining correct alignment between vias (or through-holes) formed in the substrate and conductive pads formed on a surface of the substrate. This is because the substrate film typically shrinks or expands during fabrication of the circuitry, i.e., the film dimensions are not stable during the processes used to form the conductive vias and pads on the films. In the case of fine structure processes (i.e., processes used to form conductive pads having dimensions of less than 100 microns and line pitches less than 50 microns), even a small change in the substrate's dimensions can lead to mis-alignment between the vias and pads. As via and pad sizes are reduced to achieve higher density circuit features, the via/pad alignment requirement becomes more difficult to satisfy, especially for flexible substrate materials. In addition, conventional process flows are somewhat complicated, requiring two photoresist applications and exposures.

In conventional methods of forming vias and pads, the via formation step and trace/pad patterning step are separated by intermediate process steps, such as metallization. The intermediate steps can significantly change the dimensions of the substrate films and cause mismatch between vias and pads. For example, one conventional process, termed the "semi-additive" process involves: (1) preparation of a starting material (i.e., a dielectric film with or without copper cladding); (2) formation of a via or through hole; (3) cleaning of the via or through hole; (4) formation of a thin metallization layer (e.g., a seed layer, followed by sputtering or electroless plating); (5) coating of the substrate with photoresist and patterning; (6) plating of the defined pad regions; (7) stripping of the resist; and (8) performing a seed etch. In this process flow, the via formation and patterning steps are separated by a metallization step which can cause significant dimensional change in a flexible substrate.

A second conventional method of forming vias and pads is termed the "subtractive" process and involves: (1) preparation of a starting material (e.g., a dielectric film with or without copper cladding); (2) formation of a via or through hole; (3) formation of a thin metallization layer; (4) blanket electroplating of the substrate surface; (5) coating of the substrate surface with photoresist and patterning; and (6) etching of the patterned regions to form pads and lines. However, the above process has the problem that the via/pad registration can be affected by two metallization steps, which can impact the substrate dimensions and hence alignment between the pads and vias.

What is desired is a method of forming properly aligned, conductive vias between conductive features on either side of a flexible substrate which is suitable for fabrication of fine structure elements, and which overcomes the noted disadvantages of conventional processes.

SUMMARY OF THE INVENTION

The present invention is directed to processes for forming conductive vias between circuit elements formed on either side of a flexible substrate. In one embodiment, the inventive process starts with a flexible film polyimide substrate on each side of which is arranged a layer of copper. Both of the copper surfaces are coated with photoresist. Blind vias are then drilled through the top copper layer and substrate using a controlled laser drill. The photoresist is then exposed (patterned). A plating operation is used to fill the vias with a conductive material. The resist is then developed and the line and pad structures on the surface of the copper layer are plated. The photoresist is then stripped. In a variation of this embodiment, the photoresist is exposed prior to drilling of the vias using a laser. In an alternative embodiment of the inventive process, through holes are drilled instead of blind vias. The photoresist layer is then exposed. The through hole sidewalls are then metallized. The resist is then developed and the line and pad structures on the surface of the copper layer are plated. In a variation of this embodiment, the photoresist is exposed prior to drilling of the through holes. In either embodiment, there is no process step between the photo-exposure of the resist and the laser drilling of the via(s) or through hole(s) which can impact the dimensions of the substrate. This helps to assure that there is no change in the dimensions of the flexible substrate during the process, thereby maintaining proper alignment between the conductive vias and the pads formed on the copper layers.

BRIEF DESCRIPTION OF THE DRAWINGS

FIGS. 1(A) through 1(E) show a process flow for forming fine structure layer pairs according to a first embodiment of the method of the present invention.

FIGS. 2(A) through 2(D) show a process flow for forming fine structure layer pairs according to a second embodiment of the method of the present invention.

DETAILED DESCRIPTION OF THE INVENTION

The present invention is directed to processes for forming fine structures on either side of a flexible substrate, with the structures electrically connected by a conductive via or through hole. The inventive method is capable of maintaining proper alignment between conductive pads formed on the substrate surfaces and the via. This is accomplished by performing the via drilling step and photoresist patterning step(s) for the conductive pads in close temporal proximity to each other, i.e., without any intervening step(s) that might cause dimensional changes in the substrate.

The present invention is particularly useful in the fabrication of fine structure layer pairs which have conductive lines and pads on both sides of a substrate, with the substrate typically being formed from a flexible polymer film (e.g., polyimide). The pads on the two sides are electrically connected by vias filled with a conductive material. The lines and pads can have different dimensions and separations, depending upon the desired application.

FIGS. 1(A) through 1(E) show a process flow for forming fine structure layer pairs according to a first embodiment of the method of the present invention. As shown in FIG. 1(A), the beginning structure is a polyimide substrate 10 on each side of which are formed a conductive layer 12 (typically copper). In a typical example, substrate 10 would be 50 microns thick, although dielectric layers in the range of 25 to 100 microns thick may be used. Conductive layers 12 would typically be 0.2 to several microns thick, although layers as thick as ten microns or greater may be used. The conductive layer(s) may be applied to the substrate by a suitable, conventionally known process, e.g., lamination, sputtering, deposition, plating, etc.

A layer of photoresist (elements 14 and 15 in the FIG. 1(B)) is then applied to both sides of substrate 10, i.e., on top of each conductive layer 12. Photoresist layers 14 and 15 may be of either the liquid photoresist (usually positive resist) or dry film photoresist (usually negative) type, depending upon the requirements of the devices being formed. Typically, liquid resist is used for the formation of fine line structures (i.e., a pitch of less than 30 microns). An example of such a resist is AZP 4620, available from AZ Electronic Material, 615 Palomar Ave., Sunnyvale, Calif. 94086. Suitable dry film resists include Riston, MacDermid, and Morton dry film resists. Dry film resists are typically laminated onto a surface, while liquid resists are spin coated (for small panels) and can be applied using dip coating, extrusion coating, or another suitable coating means.

The photoresist layers are then imaged (exposed) using photolithography techniques well known in the semiconductor industry. Note that the resist layers are not developed at this stage. A blind via (or vias) 16 is then drilled through top photoresist layer 14, the top conductive layer, and substrate 10, stopping at the bottom conductive layer. A controlled laser drill or other suitable means may be used for this purpose. The resulting structure is shown in FIG. 1(B).

The sidewalls of the via(s) are then cleaned. This can be accomplished by wet chemical cleaning, plasma cleaning, or another suitable method. For example, the via sidewalls can be cleaned using wet chemical means and a $CF_4/O_2$ plasma. Sulfuric acid, chromic acid, or potassium permanganate may be used as the chemical cleaning agent, with sulfuric acid or chromic acid being preferred.

A plating process is then used to fill vias 16 with a conductive material 18, typically copper. Via plating may be performed using the bottom conductive layer as the seed layer, with plating up to fill the via. In this situation the top conductive layer is not electrically connected during the plating until the vias reach the top seed layer. An advantage of this via plating method, is that the via sidewalls do not need to be metallized prior to electroplating. An electroplating method which can be used for this purpose is described in the U.S. patent application Ser. No. 09/229,503 entitled, "METHOD FOR ELECTROPLATING VIAS OR THROUGH HOLES IN SUBSTRATES HAVING CONDUCTORS ON BOTH SIDES", filed the same day as the present application and assigned to the assignee of the present invention, the contents of which is hereby incorporated by reference. The resulting structure is shown in FIG. 1(C).

Next, the photoresist is developed to define the regions on the upper and lower conductive surfaces 12 at which conductive lines and pads are desired. A plating process can then be used to form the conductive lines and pads 20. The plating process also acts to electrically connect the conductive structures on the top surface 12 to the filled via 16. The resulting structure is shown in FIG. 1(D).

The remaining photoresist is then stripped and a seed etching process is performed. Ammonium persulfate may be used to etch a copper seed. Other copper etchants may also be used. Potassium permanganate may be used to etch a Cr seed, in the situation where a Cr layer is sputtered prior to copper seed deposition for better adhesion onto a dielectric film. The resulting structure is shown in FIG. 1(E).

Note that the steps of photoresist exposure and laser via drilling may be interchanged in the described process flow. However, an important aspect of the present invention is that there are no process steps between the resist exposure and laser drilling which can affect the alignment between the via(s) and conductive pads defined by the photoresist exposure.

In order to maintain alignment between features patterned on the top resist layer and those on the bottom resist layer, alignment marks may be used. Such marks are drilled though the films using a different laser power than used to drill the vias. For example, the alignment marks may be drilled using a higher laser power than that used for drilling the vias. The programmable nature of the laser drill also permits drilling of the blind vias shown in FIG. 1. In drilling a blind via, the laser is programmed so that the first laser pulses drill through the top conductive layer and the later pulses (lower power) merely drill through the dielectric and do not penetrate the bottom conductive layer. Thus, multiple pulses with different powers can be used to drill a blind via.

FIGS. 2(A) through 2(D) show a process flow for forming fine structure layer pairs according to a second embodiment of the method of the present invention. As shown in FIG. 2(A), the beginning structure is a polyimide substrate 10 on each side of which are formed a conductive layer 12 (typically copper). As with the embodiment of FIG. 1, substrate 10 is typically 50 microns thick, with conductive layers being between 0.2 and several microns thick. Again, the conductive layer may be applied to the substrate by a suitable, conventionally known process.

A layer of photoresist (elements 14 and 15 in the figure) is applied to both sides of substrate 10, i.e., on top of each conductive layer 12. Photoresist layers 14 and 15 may be of either the liquid photoresist (usually positive resist) or dry film photoresist (usually negative) type, depending upon the requirements of the devices being formed. As noted previously, liquid resist is typically used for the formation of fine line structures (i.e., a pitch of less than 30 microns). The photoresist layers are then imaged (exposed) using photolithography techniques well known in the semiconductor industry. Note that the photoresist layers are not developed at this step in the inventive process. Through-hole(s) 17 is then drilled through top photoresist layer 14, top conductive layer 12, substrate 10, bottom conductive layer 12, and bottom photoresist layer 15. A laser drill, mechanical punch or other suitable method such as plasma or wet etching may be used to form the through-hole(s). A cleaning step may be used after the laser drilling step to clean the sidewalls of the through-hole(s). Electroless or direct plating is then used to form a metal layer on the sidewalls of through-hole(s) 17. The resulting structure is shown in FIG. 2(B).

The photoresist is then developed to define the regions on the upper and lower conductive surfaces 12 where conductive lines and pads are desired. Any metal formed on top of the resist during the formation of the sidewall metal layer is removed during this step. This assures that the later plating step used to fill up the through-hole does not form a metal layer on the resist. A plating process is then used to form the conductive lines and pads 20 and fill the through-hole with a conductive material 18. A preferred plating process is a double sided plating in which both sides of the substrate are plated at the same time, although a single-sided plating process may also be used. The resulting structure is shown in FIG. 2(C). A single sided plating process suited for use in this situation is described in the aforementioned U.S. patent application entitled "METHOD FOR ELECTROPLATING VIAS OR THROUGH HOLES IN SUBSTRATES HAVING CONDUCTORS ON BOTH SIDES".

Note that the through-hole(s) may or may not be completely filled with the plated material, depending upon the through-hole dimension(s) and thickness of the plated material. If necessary, an additional plating step may be used to fill the through-hole. The remaining photoresist is then stripped and a seed etching process carried out. The resulting structure is shown in FIG. 2(D). As with the inventive process described with reference to FIG. 1, the photoresist patterning step (exposure) and via drilling step are performed in close temporal proximity to one another, and without intervening steps that could create distortions in the flexible film. This preserves the desired alignment between the patterned conductive lines or pads and the through hole(s).

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

What is claimed is:

1. A method of manufacturing a flexible circuit board from a dielectric substrate having conductive layers disposed on both sides of the substrate, the method comprising the steps of:
   (a) forming a layer of photoresist on one of the conductive layers, wherein the conductive layer upon which the layer of photoresist is deposited is an underlying conductive layer;
   (b) forming an aperture passing through the layer of photoresist, the underlying conductive layer, and the dielectric substrate;
   (c) exposing the layer of photoresist to a pattern of actinic radiation;
   (d) forming conductive material within the aperture;
   (e) once steps (b), (c), and (d) have been performed, developing the exposed photoresist layer to expose portions of the underlying conductive layer;
   (f) once step (e) has been performed, defining at least one conductive trace using the underlying conductive layer, and using the developed photoresist layer as a mask, the conductive trace being electrically connected to the conductive material within the aperture; and
   (g) once step (f) has been performed, removing said developed photoresist layer.

2. The method of claim 1, wherein step (a) further comprises the step of forming a second layer of photoresist on a second conductive layer, step (c) further comprises the step of exposing the second layer of photoresist to a pattern of actinic radiation, step (e) further comprises the step of developing the second layer of photoresist, and step (f) further comprises the step of defining a conductive trace using the second conductive layer, and using the developed second layer of photoresist as a mask.

3. The method of claim 2, wherein step (c) is performed before step (b) is performed.

4. The method of claim 2, wherein step (d) is performed before step (c) is performed.

5. The method of claim 2 wherein the second layer of photoresist comprises a positive photoresist.

6. The method of claim 1, wherein step (c) is performed before step (b) is performed.

7. The method of claim 1, wherein step (d) is performed before step (c) is performed.

8. The method of claim 1 wherein the layer of photoresist comprises a positive photoresist.

9. The method of claim 1 wherein the underlying conductive layer comprises copper.

10. The method of claim 1 wherein the dielectric substrate comprises polyimide.

11. The method of claim 1 wherein (b) forming an aperture comprises: laser drilling an aperture passing through the layer of photoresist, the underlying conductive layer, and the dielectric substrate.

12. The method of claim 1 wherein (d) forming conductive material within the aperture comprises electroplating the conductive material within the aperture.

13. The method of claim 12 further comprising, after forming the aperture, cleaning sidewalls of the aperture with a plasma.

14. The method of claim 12 wherein sidewalls of the aperture are not metallized prior to electroplating.

15. A method of manufacturing a flexible circuit board from a dielectric substrate having a first conductive layer disposed on a side of the substrate and a second conductive layer on the other side of the substrate, the method comprising the steps of:
   (a) forming a layer of photoresist on the first conductive layer;
   (b) forming an aperture passing through the layer of photoresist, the first conductive layer, the dielectric substrate, and the second conductive layer;
   (c) exposing the layer of photoresist to a pattern of actinic radiation;
   (d) forming conductive material within the aperture;
   (e) once steps (b), (c), and (d) have been performed, developing the exposed photoresist layer to expose portions of the first conductive layer;

(f) once step (e) has been performed, defining at least one conductive trace using the first conductive layer, and using the developed photoresist layer as a mask, the conductive trace being electrically connected to the conductive material within the aperture; and (g) once step (f) has been performed, removing said developed photoresist layer.

16. The method of claim 15, wherein step (a) further comprises the step of forming a second layer of photoresist on the second conductive layer, step (b) further comprises the step of forming an aperture passing through the second layer of photoresist, step (c) further comprises the step of exposing the second layer of photoresist to a pattern of actinic radiation, step (e) further comprises the step of developing the second layer of photoresist, and step (f) further comprises the step of defining a conductive trace using the second conductive layer, and using the developed second layer of photoresist as a mask.

17. The method of claim 16, wherein step (c) is performed before step (b) is performed.

18. The method of claim 16, wherein step (d) is performed before step (c) is performed.

19. The method of claim 15, wherein step (c) is performed before step (b) is performed.

20. The method of claim 15, wherein step (d) is performed before step (c) is performed.

* * * * *